United States Patent
Mellor et al.

(10) Patent No.: US 10,118,155 B2
(45) Date of Patent: Nov. 6, 2018

(54) METHOD OF METALLIC CLUSTERS FABRICATION WITH DESIRED SIZE USING SCANNING TUNNELING MICROSCOPY TIP INDUCED REACTIONS

(71) Applicants: SABIC Global Technologies B.V., Bergen op Zoom (NL); UCL Business PLC, London (GB)

(72) Inventors: Andy Mellor, London (GB); Chi Yim, London (GB); Chi Pang, London (GB); Geoff Thornton, London (GB); Hicham Idriss, Thuwal (SA)

(73) Assignees: SABIC Global Technologies B.V., Bergen op Zoom (NL); UCL Business PLC, London (GB)

( * ) Notice: Subject to any disclaimer, the term of this patent is extended or adjusted under 35 U.S.C. 154(b) by 0 days.

(21) Appl. No.: 15/511,469

(22) PCT Filed: Aug. 11, 2016

(86) PCT No.: PCT/IB2016/054846
§ 371 (c)(1),
(2) Date: Mar. 15, 2017

(87) PCT Pub. No.: WO2017/029589
PCT Pub. Date: Feb. 23, 2017

(65) Prior Publication Data
US 2017/0282161 A1 Oct. 5, 2017

Related U.S. Application Data

(60) Provisional application No. 62/205,027, filed on Aug. 14, 2015.

(51) Int. Cl.
*B01J 21/06* (2006.01)
*B01J 23/52* (2006.01)
(Continued)

(52) U.S. Cl.
CPC .............. *B01J 23/52* (2013.01); *B01J 21/063* (2013.01); *B01J 35/004* (2013.01);
(Continued)

(58) Field of Classification Search
CPC ...... B01J 21/063; B01J 23/52; B01J 35/0006; B01J 35/004; B01J 35/0073; B01J 37/342; C23C 14/18; C23C 14/58
See application file for complete search history.

(56) References Cited

U.S. PATENT DOCUMENTS

| | | | |
|---|---|---|---|
| 5,935,454 A | 8/1999 | Tada et al. | 216/41 |
| 2010/0239775 A1 | 9/2010 | Zhou et al. | 427/457 |
| 2013/0199673 A1 | 8/2013 | Yanson et al. | 148/24 |

FOREIGN PATENT DOCUMENTS

| | | |
|---|---|---|
| CN | 101780403 B | 7/2012 |
| CN | 102689897 A | 9/2012 |

(Continued)

OTHER PUBLICATIONS

Acharya et al., *J. Phys. Chem. C* 114, 21510-21515 (2010).
(Continued)

*Primary Examiner* — Cam N. Nguyen
(74) *Attorney, Agent, or Firm* — Norton Rose Fulbright US LLP

(57) ABSTRACT

A method of transferring a single metal atom from a first location to a second location on the surface of a metal oxide is disclosed. The method includes obtaining a material having a first metal atom deposited on a first oxygen atom vacancy of the metal oxide and transferring the first metal atom of the metal on the first oxygen atom vacancy to a second location on the metal oxide by applying a voltage to the first metal atom. The second location can be a second metal atom on a second oxygen atom vacancy of the metal oxide, where the first and second metal atoms form a first (Continued)

metal atom-second metal atom species, or a metal atom of the metal oxide, where the first metal atom and the metal atom of the metal oxide forms a first metal atom-metal atom of the metal oxide species.

20 Claims, 12 Drawing Sheets

(51) Int. Cl.
       *B01J 35/00*        (2006.01)
       *B01J 37/34*        (2006.01)
       *C23C 14/18*        (2006.01)
       *C23C 14/58*        (2006.01)
       *B82B 3/00*        (2006.01)

(52) U.S. Cl.
       CPC ....... *B01J 35/0006* (2013.01); *B01J 35/0073* (2013.01); *B01J 37/342* (2013.01); *B82B 3/0004* (2013.01); *C23C 14/18* (2013.01); *C23C 14/58* (2013.01)

(56) References Cited

FOREIGN PATENT DOCUMENTS

| CN | 103551146 A | 2/2014 |
|----|----|----|
| CN | 104302397 A | 1/2015 |
| EP | 2703078 A1 | 3/2014 |
| WO | WO 2009135150 | 5/2009 |

OTHER PUBLICATIONS

Bamwenda et al., *Catalysis Letters* 44, 83-87 (1997).
Bamwenda et al., *Journal of Photochemistry and Photobiology, A: Chemistry* 89, 177-189 (1995).
Byron S.R.J., Muruganandam L., Murthy S.S., Int. J. Chem. React. Eng., 8 The Berkeley Electronic Press (2010).
Chauvin, et al., *Journal of Catalysis*. 121, 56-69 (1990).
Chen et al., *Applied Catalysis A: General* 433-434, 236-242 (2012).
Chretien et al., *Current Opinion in Solid State and Materials Science* 11, 62-75 (2007).
Freund et al., *Rep. Prog. Phys.* 59, 283-347 (1996).
Hanaor et al., J. Material Science, 2011, vol. 46, pp. 855-874.
Hla, *J. Vac. Sci. Technol. B.*, 23(4), 1351-1360, 2005.
International Search Report and Written Opinion for PCT/IB2016/054846, dated Dec. 8, 2016.
Jovic et al. *Topics in Catalysis*, 56, 1139-1151 (2013).
Jovic et al., *J. Catalysis*, 305, 307-317 (2013).
Kiselev, V. F., Krylov, O. V., Adsorption and Catalysis on Transition Metals and Their Oxides, Springer Series in Surface Sciences, vol. 9, Springer-Verlag Berlin Heidelberg, ISBN 978-3-642-73887-6 (1989).
Lai et al., *Mol. Catal. A: Chemical* 162, 33-50 (2000).
Matthey et al., *Science* 315, 1692-1696 (2007).
Murdoch et al., *Nature Chemistry* 3, 489-492 (2011).
Pichat et al., *Catalysis on the Energy Scene* 19, 319-326 (1984).
Soukiassian, L, Mayne, A.J., Carbone, M., Dujardin, G., Atomic-scale desorption of H atoms from the Si(100) 2 x 1:H surface: Inelastic electron interactions, *Physical Review B* 68, 035303 (2003).
Stensgaard, *Dekker Encyclopedia of Nanoscience and Nanotechnology*, 3, 1813-1820, 2004.
Tabakova et al., *Applied Catalysis B: Environmental* 101, 256-265 (2011).
Tong et al., *J. Am. Chem. Soc.*, 127, 13516-13518 (2005).
Trovarelli, *Catalysis Reviews: Science and Engineering*, 38(4), 439-520 (1996).
Twigg, M.V., *Catalyst Handbook*, Wolfe Publishing Ltd, From England (1989).
Valden et al., *Catalysis Letters* 56, 7-10 (1998).
Waterhouse et al., *Scientific Reports*, 3:2849, 2013.
Wendt et al., *Surface Science*, 505, 137-152 (2002).
Xu et al., *Journal of Vacuum Science & Technology A: Vacuum, Surfaces, and Films* 15, 1261 (1997).

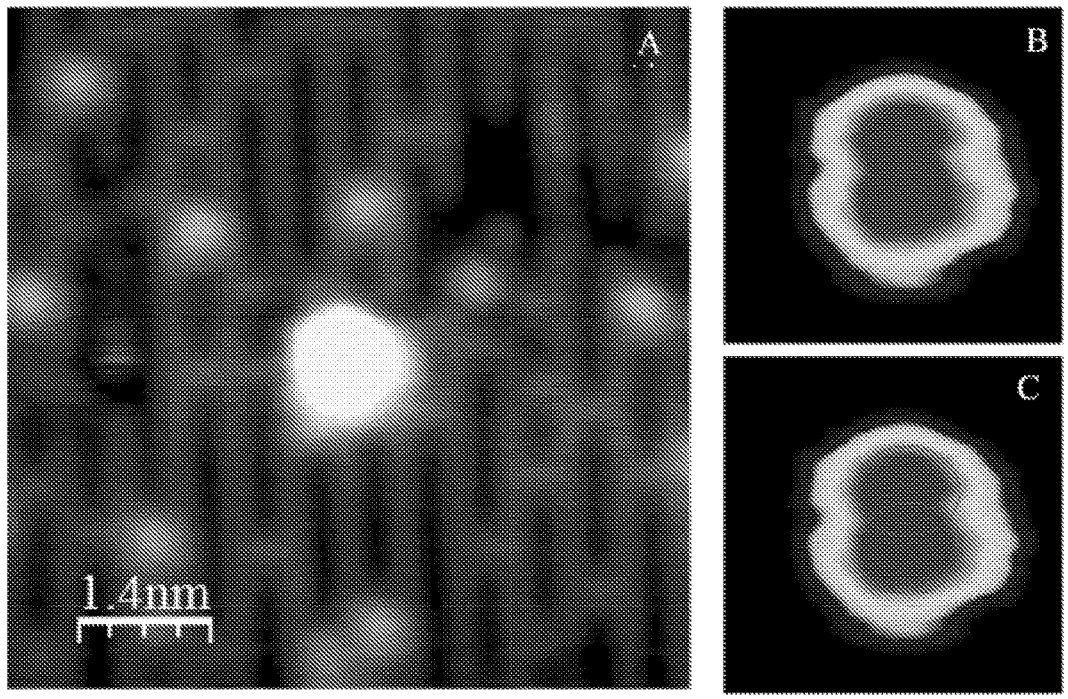
FIG. 10A-10C
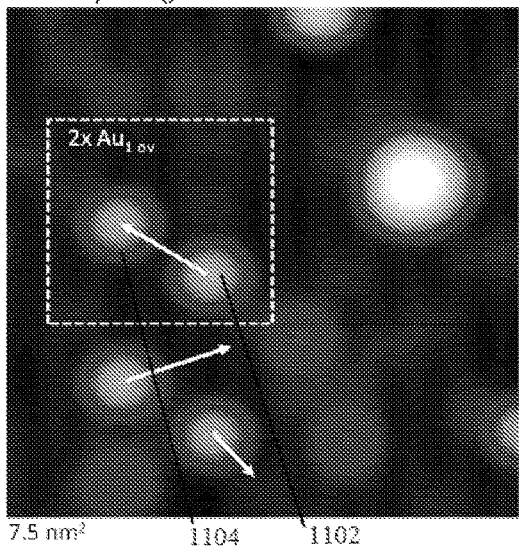
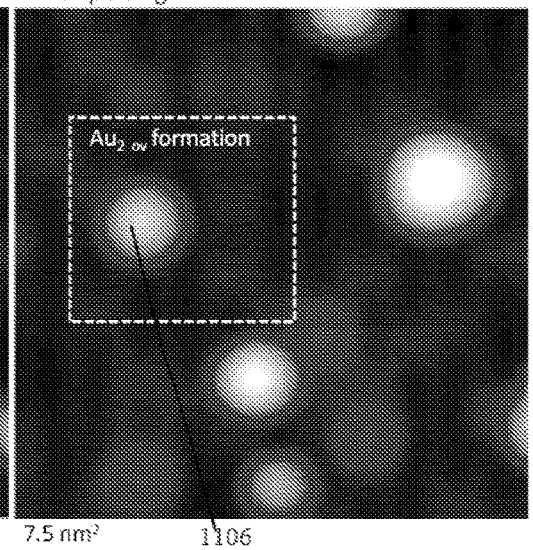
FIG. 11A                FIG. 11B

US 10,118,155 B2

METHOD OF METALLIC CLUSTERS FABRICATION WITH DESIRED SIZE USING SCANNING TUNNELING MICROSCOPY TIP INDUCED REACTIONS

CROSS REFERENCE TO RELATED APPLICATIONS

This application is a national phase application under 35 U.S.C. § 371 of International Application No. PCT/IB2016/054846 filed Aug. 11, 2016, which claims the benefit of priority of U.S. Provisional Patent Application No. 62/205,027, filed Aug. 14, 2015. The entire contents of each of the above-referenced disclosures are specifically incorporated herein by reference without disclaimer.

BACKGROUND OF THE INVENTION

A. Field of the Invention

The invention generally concerns methods of transferring a single metal atom from a first location to a second location on the surface of a metal oxide. In particular, the method can include transferring a first metal atom deposited on a first oxygen atom vacancy of a metal oxide to a second location on the metal oxide by applying voltage to the first metal atom.

B. Description of Related Art

Catalysis by metals and metal oxides is central to many chemical and petrochemical processes. Catalysts composed of metals deposited on metal oxides have common applications extending from automobile catalytic converters, methanol synthesis, ammonia synthesis, water gas shift reactions, selective reduction as well as oxidation processes. In particular metal clusters, as well as metal nanoparticles, can be very active for chemical reactions when deposited on reducible oxides such as titanium dioxide ($TiO_2$), cerium oxide ($CeO_2$), and iron oxide ($Fe_2O_3$). By way of example, Lai et al., in *Mol. Catal. A: Chemical,* 2000, 162, describes gold (Au) particles of a finite size-range as being active for carbon monoxide (CO) oxidation to carbon dioxide ($CO_2$) when deposited on rutile $TiO_2$ (110) single crystal. In photocatalytic reactions it has been demonstrated that the percentage of Au deposited on $TiO_2$ (P25) can be changed while keeping the gold particle size constant (about 5 nm) (See, Waterhouse et al., in *Scientific Reports,* 2013, Vol. 3, pp. 2849 and Jovic et al. in *Topics in Catalysis,* 2013, Vol. 56, pp. 1139-1151).

Manipulation of nanosized material from one location to another location using scanning tunneling microscopy (STM) or scanning probe microscope (SPM) has been used in various nanotechnologies to manipulate molecules. By way of example, Hla in *Sci. Technol. B* 2005, Vol. 23, pp. 1351-1360 describes atom/molecule manipulations and its application to nanoscience and technology. Another example is U.S. Patent Application Publication No. 2010/0239775 to Zhou et al., which describes methods of selectively transferring proteins from one location to another using STM where the number of particle material and the location of deposition can be controlled by varying the polarity of the potential, pulse period, and the clearance between the STM tip and a surface. However, currently available methods suffer in that the movement of atoms is generally limited to movement of multiple atoms and, thus precision in the movement of the atoms from one position to another is limited.

SUMMARY OF THE INVENTION

A discovery has been made that solves the problems of the prior art. The discovery lies in the ability to precisely move a metal atom (e.g., gold atom) deposited on a metal oxide surface (e.g., titanium dioxide) from one site to another site. In particular, the methods of the present invention allow movement of the metal atom from one location to another on the surface of the metal oxide crystal and/or to combine two metal atoms to create metal clusters on the metal oxide surface. Without wishing to be bound by theory, a reaction model, based on tunneling current measurements as a function of time, is proposed in which two electrons can be used to move the metal atom. The methods of the present invention can be used, for example, to design catalysts at the atomic scale. In one instance, the methods of the present invention can be used to identify the contribution of individual atoms for catalytic reactions and maximize the efficiency of the resulting catalysts. In another instance, the structure of the catalysts can be tuned by controlling the metal cluster size and/or its location vis-à-vis the metal oxide surface.

In a particular aspect of the invention, a method of transferring a single metal atom from a first location to a second location on the surface of a metal oxide is described. The method can include obtaining a material (e.g., a photocatalyst) having metal atoms (e.g., gold (Au), palladium (Pd), rhodium (Rh), or platinum (Pt) atoms) deposited on the surface of a metal oxide (e.g., titanium dioxide ($TiO_2$), zinc oxide (ZnO), tin oxide ($SnO_2$) or iron oxide ($Fe_2O_3$)). A first metal atom (e.g., Au) can be transferred to a second metal atom by applying voltage to the first metal atom. The first and second metal atoms can bond and form a metal-metal species (e.g., Au—Au bond or $Au_2$ species). Alternatively, the first metal atom (e.g., Au) can be moved to a metal atom of the metal oxide (titanium oxide) such that a bond can form between the first metal atom (Au) and the metal atom of the metal oxide (Ti) to form a metal atom-metal oxide atom species (e.g., Au—Ti species). Such a transfer process can be used to create a metal cluster having a particular particle size (e.g., metal cluster such as Au metal cluster can be tuned to a targeted size) and/or to position the metal atoms on the surface of the metal oxide catalyst at desired locations (e.g., positioning the metal or metal cluster) to maximize the efficiency of the resulting catalyst. The voltage can be applied in a range of −3.0 V to +3.0, preferably from −2.5 to +2.5. In some aspects, the voltage can be applied for 300 milliseconds to 400 milliseconds at a current of 25 pA to 75 pA. In some aspects of the invention, the voltage is pulsed. In some aspects of the invention, a scanning tunneling microscope (STM) (e.g., a STM having a tungsten tip) can be used in the transfer process. When titanium dioxide is used as the metal oxide, the titanium dioxide can include single phase anatase, single phase rutile, a physical mixture of single phase anatase, and single phase rutile, or a mixed phase of anatase and rutile. When the titanium dioxide is a mixture of anatase and rutile or a mixed phase of anatase and rutile, a ratio of anatase to rutile ranges from 1.5:1 to 10:1, preferably 3:1 to 8:1, and most preferably from 5:1 to 7:1. In some aspects of the invention, the metal oxide surface is reduced. In other aspects of the invention, a photocatalyst can be made using the methods described throughout the specification. In a particular aspect of the invention, a method for designing a photocatalyst includes selectively obtaining a desired size and/or position of a metal cluster deposited on a metal oxide by using the methods described throughout the specification.

In the context of the present invention, 20 embodiments are described. Embodiment 1 is a method of transferring a single metal atom from a first location to a second location on the surface of a metal oxide, the method can include: (a) obtaining a material having metal atoms deposited on the surface of a metal oxide, wherein a first metal atom is deposited on a first oxygen atom vacancy of the metal oxide; and (b) transferring the first metal atom on the first oxygen atom vacancy to a second location on the metal oxide by applying a voltage to the first metal atom, wherein the second location is a second metal atom on a second oxygen atom vacancy of the metal oxide, and wherein the first and second metal atoms form a first metal atom-second metal atom species, or wherein the second location is a metal atom of the metal oxide, and wherein the first metal atom and the metal atom of the metal oxide forms a first metal atom-metal atom of the metal oxide species. Embodiment 2 is the method of embodiment 1, wherein the metal oxide is titanium dioxide and the metal atoms deposited on the surface of the titanium dioxide are gold atoms. Embodiment 3 is the method of embodiment 2, wherein the first metal atom-second metal atom species is a $Au_2$ species. Embodiment 4 is the method of embodiment 2, wherein the first metal atom-metal atom of the metal oxide species is a Au—Ti species. Embodiment 5 is the method of any one of embodiments 1 to 4, wherein the voltage ranges from −3.0 V to +3.0, preferably from −2.5 to +2.5. Embodiment 6 is the method of embodiment 5, wherein the voltage is pulsed voltage. Embodiment 7 is the method of any one of embodiments 5 to 6, wherein the voltage is applied for 300 milliseconds to 400 milliseconds at a current of 25 pA to 75 pA. Embodiment 8 is the method of any one of embodiments 2 to 7, wherein the titanium dioxide is single phase anatase or single phase rutile. Embodiment 9 is the method of any one of embodiments 2 to 7, wherein the titanium dioxide comprises a mixture of anatase and rutile. Embodiment 10 is the method of embodiment 9, wherein the ratio of anatase to rutile ranges from 1.5:1 to 10:1, preferably 3:1 to 8:1, and most preferably from 5:1 to 7:1. Embodiment 11 is the method of any one of embodiments 9 to 10, wherein the titanium dioxide is a mixed phase of anatase and rutile. Embodiment 12 is the method of embodiment 1, wherein the metal oxide is $TiO_2$, $SnO_2$, $Fe_2O_3$, ZnO, or any combination thereof. Embodiment 13 is the method of any one of embodiments 1 and 12, wherein the metal atoms deposited on the surface of the metal oxide are gold, silver, palladium, rhodium, or platinum atoms. Embodiment 14 is the method of any one of embodiments 1 to 13, wherein the surface of the metal oxide is reduced. Embodiment 15 is the method of any one of embodiments 1 to 14, wherein a scanning tunneling microscope (STM) is used in step (b) to transfer the first metal atom on the first oxygen atom vacancy to a second location on the metal oxide by applying a voltage to the first metal atom. Embodiment 16 is the method of embodiment 15, wherein the STM has a tungsten tip. Embodiment 17 is the method of any one of embodiments 1 to 16, wherein a cluster of metal atoms having a targeted size is obtained. Embodiment 18 is the method of any one of embodiments 1 to 17, wherein the material is a photocatalyst. Embodiment 19 is a photocatalyst made by a method of any one of embodiments 1 to 18. Embodiment 20 is a method for designing a photocatalyst comprising selectively obtaining a desired size and/or position of a metal cluster deposited on a metal oxide by using the method of any one of claims 1 to 18.

The following includes definitions of various terms and phrases used throughout this specification.

The term "cluster" or "metal cluster" refers to 3 or more single metal atoms bonded together.

The acronym "STM" refers to a scanning tunneling microscope or scanning tunneling microscopy.

The terms "stylus" or "tip" refers to a probe for use in scanning tunneling microscopy, which when electrically charged and brought sufficiently close to a surface, can deliver a tunneling current between the conducting or semi-conducting surface atoms and the tip.

The terms "about" or "approximately" are defined as being close to as understood by one of ordinary skill in the art. In one non-limiting embodiment, the terms are defined to be within 10%, preferably within 5%, more preferably within 1%, and most preferably within 0.5%.

The term "substantially" and its variations are defined to include ranges within 10%, within 5%, within 1%, or within 0.5%.

The terms "wt. %" or "vol. %" refers to a weight or volume percentage of a component, respectively, based on the total weight or the total volume of material that includes the component. In a non-limiting example, 10 grams of material in 100 grams of the component is 10 wt. % of material.

The terms "inhibiting" or "reducing" or "preventing" or "avoiding" or any variation of these terms, when used in the claims and/or the specification includes any measurable decrease or complete inhibition to achieve a desired result.

The term "effective," as that term is used in the specification and/or claims, means adequate to accomplish a desired, expected, or intended result.

The use of the words "a" or "an" when used in conjunction with any of the terms "comprising," "including," "containing," or "having" in the claims or the specification may mean "one," but it is also consistent with the meaning of "one or more," "at least one," and "one or more than one."

The words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The methods of the present invention can "comprise," "consist essentially of," or "consist of" particular ingredients, components, compositions, etc. disclosed throughout the specification. With respect to the transitional phase "consisting essentially of," in one non-limiting aspect, a basic and novel characteristic of the methods of the present invention are their ability to design and make a photocatalyst that includes a desired size and/or position of a metal cluster deposited on a metal oxide.

Other objects, features and advantages of the present invention will become apparent from the following figures, detailed description, and examples. It should be understood, however, that the figures, detailed description, and examples, while indicating specific embodiments of the invention, are given by way of illustration only and are not meant to be limiting. Additionally, it is contemplated that changes and modifications within the spirit and scope of the invention will become apparent to those skilled in the art from this detailed description. In further embodiments, features from specific embodiments may be combined with features from other embodiments. For example, features from one embodiment may be combined with features from any of the other embodiments. In further embodiments, additional features may be added to the specific embodiments described herein.

BRIEF DESCRIPTION OF THE DRAWINGS

Advantages of the present invention may become apparent to those skilled in the art with the benefit of the following detailed description and upon reference to the accompanying drawings.

FIG. 10A depicts a topographic STM image of a $Au_1$ particle.

FIG. 10B depicts a high contrast, close-up of the particle in FIG. 7A.

FIG. 10C depicts a high contrast, close-up of the particle in FIG. 7A, with an overlay highlighting the two nodes at the center.

FIGS. 11A and 11B depict STM images of STM tip induction of $Au_1$ atom before pulsing and after pulsing.

Figure 1:
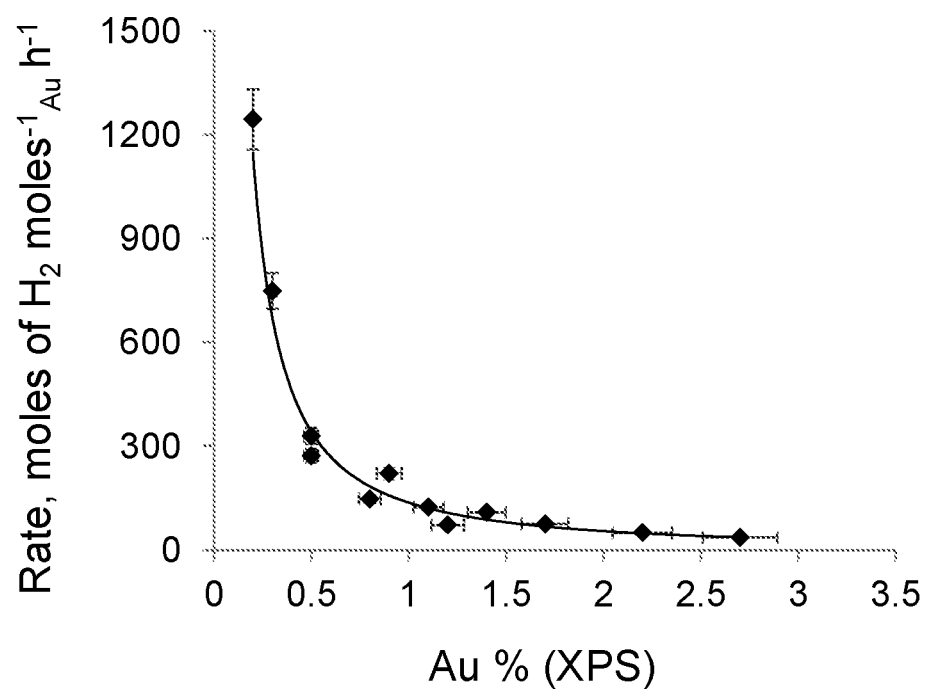
FIG. 1 is a plot of normalized rate of hydrogen production per gold atom as a function of available gold particles on the surface and near the surface of a titanium dioxide semiconductor material.

While the invention is susceptible to various modifications and alternative forms, specific embodiments thereof are shown by way of example in the drawings and may herein be described in detail. The drawings may not be to scale.

DETAILED DESCRIPTION OF THE INVENTION

Conventional transferring of nanoscale materials from one point to another can result in imprecise assembling and dissembling of metal atoms, thereby resulting in formation of metal clusters unevenly dispersed on the base material.

The present invention solves these problems by being able to design catalysts on an atomic scale. The method allows single metal atoms to be manipulated so that they change their position from one site to another site on the surface of the base material (e.g., a metal oxide). In particular, the method of the present invention can be used to transfer one metal atom adsorbed in an oxygen vacancy to another site on the surface of metal oxide. The ability to design a material having metal atoms in a desired size and location can result in the formation of a catalyst or photocatalyst having a minimum amount of metals with as high as possible dispersion on the surface or in the catalyst. Such a catalyst or photocatalyst can be used in the production of water. By way of example, FIG. 1 is a plot of normalized rate of hydrogen production per gold atom as a function of available gold particles on the surface and near the surface of a titanium dioxide semiconductor material. From data, it can be seen that the highest production (per Au atom) occurs for the smallest amount of Au deposited. Without wishing to be bound by theory, it is believed that there is a tradeoff between the unavoidable defects created at the metal/metal oxide interface (acting as electron-hole recombination centers therefore decreasing the overall catalytic reaction) and the need for the metal to be present in order to pump excited electrons away from the conduction band (therefore decreasing the electron-hole recombination rates). In other words one needs to have a minimum amount of metals (Au for example) with as high as possible of dispersion for the design of the most active metal based semiconductor catalysts (e.g., photocatalysts). The present invention provides for a method of making a catalyst (e.g., a photocatalyst) with a minimum amount of metals (e.g., Au) with as high as possible of dispersion on the metal oxide surface (e.g., $TiO_2$).

These and other non-limiting aspects of the present invention are discussed in further detail in the following sections.

A. Material Having Metal Atoms Deposited on a Metal Oxide

Figure 2:
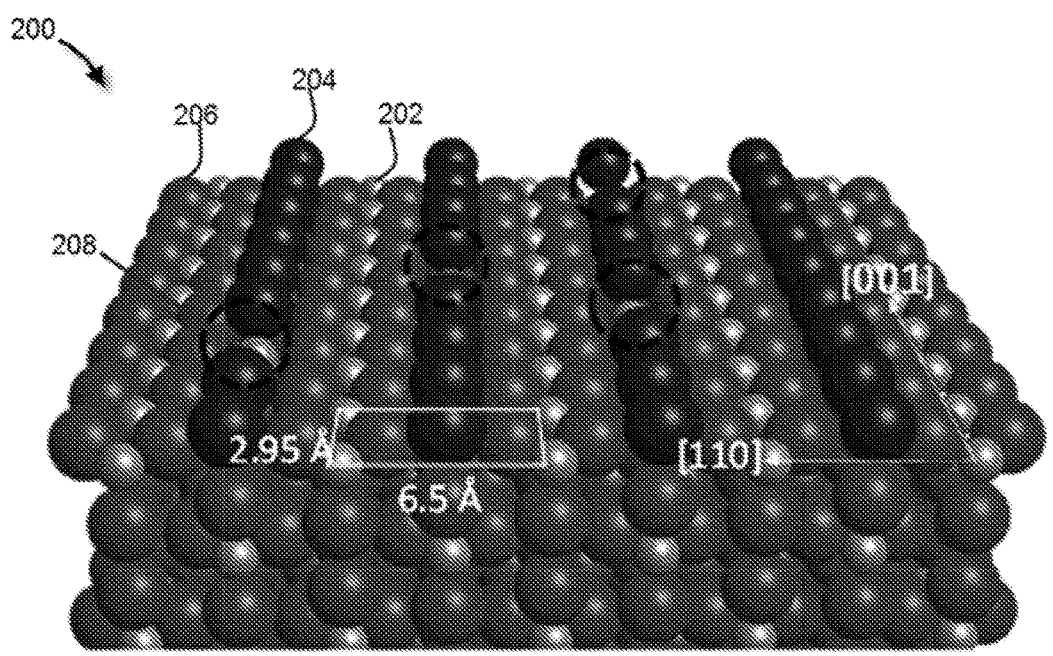
FIG. 2 depicts a ball model of a surface of metal oxide of the present invention.

The material having the metal atoms deposited on the surface of metal oxide can be fabricated as described in the Examples section. FIG. 2 depicts a ball model of a surface of the metal oxide (e.g., $TiO_2$, ZnO, $SnO_2$ or $Fe_2O_3$). In FIG. 2, the metal oxide surface includes alternating rows of metal oxide atoms 202 and of bridging oxygen atoms 204 and non-bridging atoms 206, oxygen vacancies 208. Without wishing to be bound by theory, it is believed that the metal below the oxygen vacancy can have a positive charge. Using STM, the amount of surface oxygen vacancies can be calculated (for example, a gold deposited titanium dioxide material can have about 10% oxygen vacancies) for a titanium dioxide substrate.

1. Metal Oxide

The metal oxide can include $TiO_2$, ZnO, $SnO_2$ or $Fe_2O_3$ or any combination thereof. In a preferred embodiment, the metal oxide is titanium dioxide. Titanium dioxide can be in the form of three phases, the anatase phase, the rutile phase, and the brookite phase. Anatase and rutile phases have a tetragonal crystal system, whereas the brookite phase has an orthorhombic crystal system. While anatase and rutile both have a tetragonal crystal system consisting of $TiO_6$ octahedra, their phases differ in that anatase are arranged such that four edges of the octahedras are shared, while in rutile, two edges of the octahedras are shared. These different crystal structures result in different density of states (DOS) may account for the different efficiencies observed for transfer of charge carriers (electrons) in the rutile and anatase phases and the different physical properties of the catalyst. For example, anatase is more efficient than rutile in the charge transfer, but is not as durable as rutile. Each of the different phases can be purchased from various manufactures and supplies (e.g., titanium (IV) oxide anatase nano powder and titanium (IV) oxide rutile nano powder in a variety of sizes and shapes can be obtained from Sigma-Aldrich® Co. LLC (St. Louis, Mo., USA) and from Alfa Aesar GmbH & Co KG, A Johnson Matthey Company (Germany)); all phases of titanium dioxide from L.E.B. Enterprises, Inc. (Hollywood, Fla. USA)). They can also be synthesized using known sol-gel methods (See, for example, Chen et al., *Chem. Rev.* 2010 Vol. 110, pp. 6503-6570, the contents of which are incorporated herein by reference).

In one aspect of the invention, mixed phase titanium dioxide anatase and rutile may be a transformation product obtained from heat-treating single phase titanium dioxide anatase at selected temperatures. Heat-treating the single phase titanium dioxide anatase nanoparticle produces small particles of rutile on top of anatase particles, thus maximizing the interface between both phases and at the same time allowing for a large number of adsorbates (water and ethanol) to be in contact with both phases, due to the initial small particle size. Single phase $TiO_2$ anatase nanoparticles that are transformed into mixed phase $TiO_2$ nanoparticles have a surface area of about 45 to 80 $m^2/g$, 45 to 75 $m^2/g$, or 50 $m^2/g$ to 70 $m^2/g$, or preferably about 50 $m^2/g$. The particle size of these single phase $TiO_2$ anatase nanoparticles is less than 95 nanometers, less than 50 nm, less than 20, or preferably between 10 and 25 nm or any range or value there between (e.g., 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, and 95). Heat treating conditions can be varied based on the $TiO_2$ anatase particle size and/or method of heating (See, for example, Hanaor et al. in *Review of the anatase to rutile phase transformation*, J. Material Science, 2011, Vol. 46, pp. 855-874), and are sufficient to transform single phase titanium dioxide to mixed phase titanium dioxide anatase and rutile. Other methods of making mixed phase titanium dioxide materials include flame pyrolysis of $TiCl_4$, solvothermal/hydrothermal methods, chemical vapor deposition, and physical vapor deposition methods. Using a ratio of anatase to rutile of 1.5:1 or greater can substantially increase the photocatalytic activity of the semiconductor material. The mixed phase $TiO_2$ nanoparticles of the present invention can have a ratio of anatase and rutile phase ranges from 1.5:1 to 10:1, from 3:1 to 8:1, or from 5:1 7:1, from 6:1 to 5:1, from 5:1 to 4:1, or from 2:1. Without wishing to be bound by theory, it is believed that this ratio and the particle structure may allow for the efficient transfer of charge carriers (electrons) from the rutile phase to the anatase phase when the titanium dioxide is used as a photocatalyst. When the photocatalyst is activated by a light source, the charge carriers in the anatase phase have an increased chance of being transferred to the metal conducting materials rather than undergoing an electron-hole recombination event.

2. Metal Atoms

Figure 3:
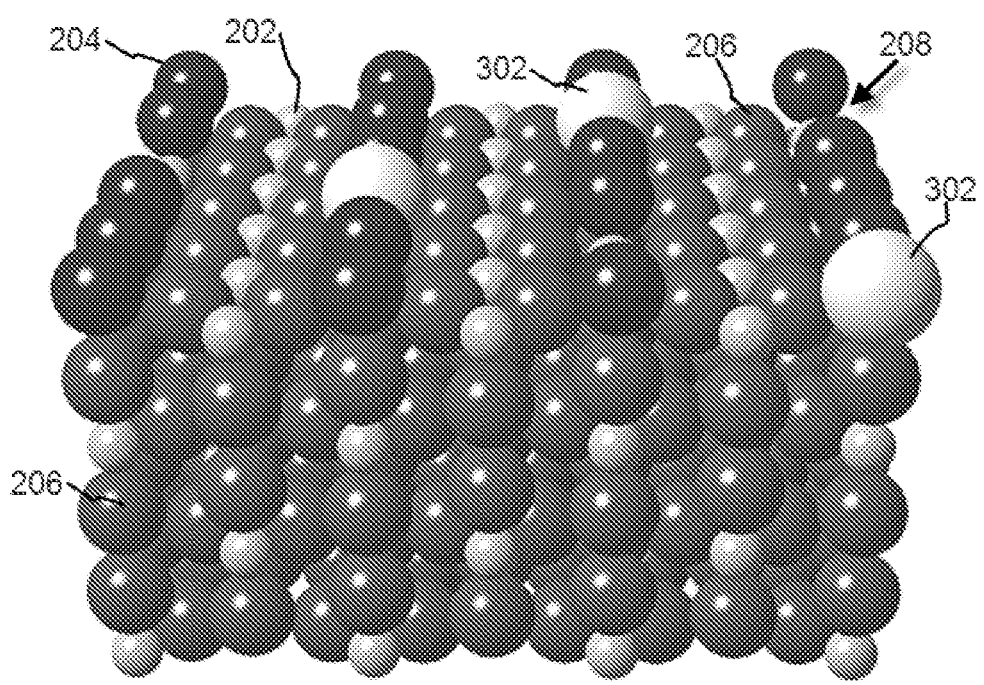
FIG. 3 depicts a ball model of gold atoms positioned on a surface of metal oxide of the present invention.

The metal atoms of the present invention can include silver (Ag), palladium (Pd), platinum (Pt), gold (Au), Rhodium (Rh) atoms or any combination thereof. Sources of metal atoms (e.g., tantalum filament wrapped around a gold rod) can be obtained from a commercial supplier such as Advent Research Materials Ltd. (United Kingdom) or R.D. Mathis Company (U.S.A.) By way of example, the metal atoms used in the Examples were obtained from Advent Research Materials Ltd. Metal atoms can be deposited on the surface of the metal oxide using known deposition techniques. For example, the metal atoms can be deposited on the surface of a metal oxide at a temperature of 200 K to 400 K, 250 K to 350 K, 275 K to 325 K, and or about 300 K with a metal filament attached to a gold containing material. The metal atoms are preferably distributed homogeneously over the terraces of the metal oxide. Smaller metal atoms can adsorb on the bridging oxygen atoms 204 while larger metal atoms can span multiple sites being centered on a bridging oxygen atoms 204 or along the metal oxide atom 202. Metal atoms can adsorb in the oxygen vacancies 208. Without wishing to be bound by theory, it is believed that for a single metal atom (e.g., Au), the most stable configuration is found to be adsorption in an oxygen vacancy site. This configuration is more stable (e.g., by 0.45 eV for Au adsorbed on $TiO_2$) than the metal atom adsorbed on top of a bridging oxygen atom on the stoichiometric surface, and more stable (e.g., by 0.80 eV for Au adsorbed on $TiO_2$) than adsorption on top of a metal atom of the metal oxide (e.g., Ti atom). The metal atoms dispersed on the surface can include single atoms (monomers), two atom species (dimers), three atom species (trimers), clusters or combinations thereof of metal atoms. It was surprisingly found that during the deposition process metal dimers could be fabricated in addition to single atoms or clusters of metal atoms (e.g., trimers or higher number of metal atoms). In some embodiments, the dimer can be tightly bound to the surface of the metal oxide (e.g., the metal dimer does not move or desorb after applying a voltage). The metal atoms can form bonds with the metal of the metal oxide below the oxygen atom vacency. FIG. 3 is an illustration of a ball model of the surface of the metal oxide with a gold atoms positioned on the surface of the metal oxide. As in FIG. 2, the metal oxide surface includes alternating rows of metal oxide (e.g., titanium) atoms 202 and of bridging oxygen atoms 204 and non-bridging atoms 206, and oxygen vacancies 208. Gold atoms 302 can be positioned in oxygen vacancies 208.

In some embodiments, the height of the metal atom sitting on top of an oxygen vacancy can be lower than the top of a surface metal oxide atom (e.g. by about 0.6 Angstroms). For example, a gold atom on top of an oxygen vacancy of a titanium dioxide substrate can have a height of about 1.9 Angstroms, while a gold atom on top of a surface of a titanium atom can have a height of about 2.5 Angstroms along the [11bar0] direction.

B. Transfer of Deposited Atoms

The material having the metal atoms deposited on the surface of the metal oxide surface can be treated under conditions sufficient to move a metal atom positioned on top of the oxygen vacancy to a second location on the metal oxide substrate. Such a treatment includes applying a voltage to the first metal atom. Voltages can range from −3.0 V to +3.0, preferably from −2.5 to +2.5. The voltage can be applied or pulsed for milliseconds (e.g., 300, 310, 320, 330, 340, 350, 360, 370, 380, 390, 400 milliseconds, or any value there between) at a desired current (e.g., 25 pA, 30 pA, 35 pA, 45 pA, 50 pA, 55 pA, 60 pA, 65 pA, 70 pA or 75 pA or any value there between). In a particular instance, STM can be used to move the atoms from one location to another. STM can employ a stylus that has been treated so that it has an atomically sharp tip. When a potential difference is applied to a stylus and the stylus is brought sufficiently close to a surface, a tunneling current flows between the surface and the stylus. Without wishing to be bound by theory, it is believed that a decrease in current is associated with metal atom movement, which leaves behind a less dense charged site and that desorption of the metal atom is not associated by electronic loss. The mathematical model shown in the Examples section incorporating the current intensity as well as time at a fixed pulse voltage can be used to understand the energy needed for the movement of the metal atoms.

Figure 4A:
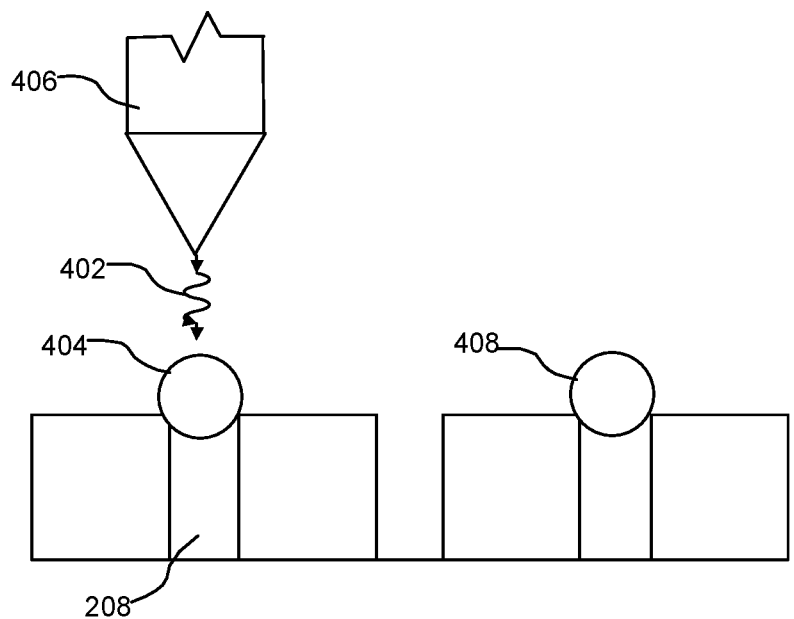
FIGS. 4A and 4B depict a schematic of moving an atom using the method of the present invention.
Figure 4B:
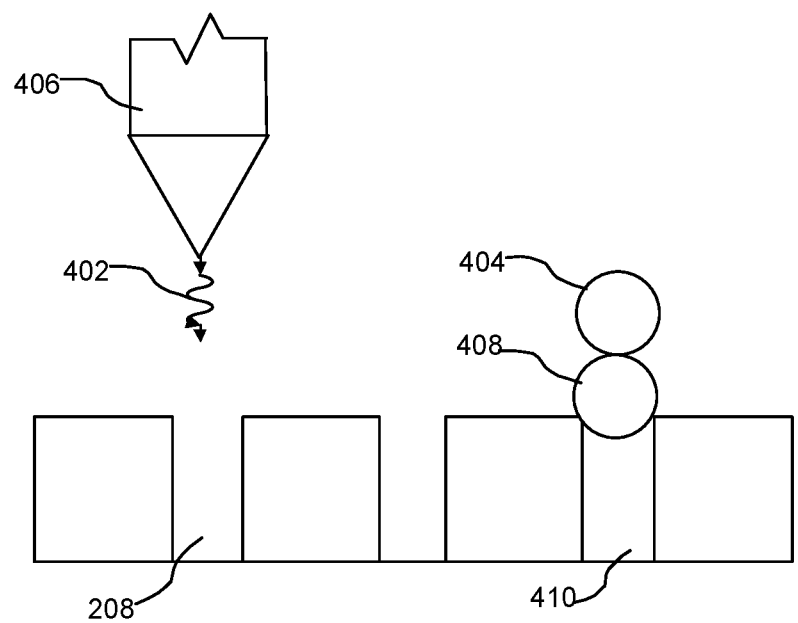

Referring to FIGS. 4A and 4B, a schematic of moving an atom is depicted. In FIG. 3A, a pulse 402 (e.g., a 2 V pulse at 50 pA) can be applied to a first atom ($M^1$) 404 positioned on a first oxygen atom vacancy 208 using a pulse generating unit 406. In some embodiments, the pulse generating unit is an STM, and the pulse is applied by positioning a tip of the STM near the atom. Due to electrical excitation, the first atom 404 moves from its position on the oxygen vacancy to a second metal atom ($M^2$) 408 positioned in a second oxygen vacancy 410 of the metal oxide to form a metal atom-metal atom species ($M^1$-$M^2$) or a metal dimer. This reaction represented in Equation (1):

$$M^1 + M^2 \rightarrow M^1\text{-}M^2 \quad (1)$$

where $M^1$ and $M^2$ are metal atoms of the present invention.

In a manner similar to that shown in FIGS. 4A and 4B, a third metal atom ($M^3$) positioned on a third oxygen atom vacancy of the metal oxide can be pulsed as described throughout the specification and moved to a metal atom of the metal oxide (e.g., metal atom 202 in FIG. 2) and a metal atom-metal oxide atom species is formed. This reaction is represented in Equation (2).

$$M^3 + M^4 O_x \rightarrow [M^3\text{-}M^4 O_x] \quad (2)$$

where $M^3$ is a metal atom of the present invention, $M^4$ is a metal atom of a metal oxide of the present invention and x represents the atomic ratio of the oxygen in the original metal oxide substrate.

The method can be repeated to form clusters of metal atoms bonded to each other, or until the desired number of metal-metal species, metal-metal oxide species, or metal clusters are formed on the metal oxide surface. In a preferred embodiment, only metal atom-metal atom bonds (e.g., dimers) or metal-metal oxide atom species are fabricated.

EXAMPLES

The present invention will be described in greater detail by way of specific examples. The following examples are offered for illustrative purposes only, and are not intended to limit the invention in any manner. Those of skill in the art will readily recognize a variety of noncritical parameters which can be changed or modified to yield essentially the same results.

General

All experiments were carried out in a two chamber ultra high vacuum system. Pressures of $<3 \times 10^{-10}$ and $<3 \times 10^{-11}$ mbar were maintained at all times in the preparation and STM chambers respectively. A rutile $TiO_2$ (110) (1×1) single crystal sample was reduced by successive cycles of argon ion sputtering, and vacuum annealing to 1000 K. Sample heating was performed via electron bombardment, using a filament positioned below the sample plate on the manipulator. All STM data were recorded at 78 K using an Omicron GmbH Low Temperature STM. Scanning was performed in Constant Current (CC) mode with an electrochemically etched tungsten tip, conditioned through voltage pulsing. Dual-mode STM scanning was performed by switching the polarity of the tunnel junction between forwards and backwards scans. Excitation of the surface by high energy electrons can be caused by relatively large voltage changes, to avoid this while scanning the delay time between forwards and backwards scans was increased to 0.3 s (from 250 µs).

Example 1

Deposition of Metal (Au) on Metal Oxide Substrate ($TiO_2$)

Au was deposited onto $TiO_2$ (110) using physical vapor deposition (PVD) at a sample temperature of 300 K. The deposition source consisted of a tantalum filament wrapped around an Au rod, which was resistively heated. On heating, Au atoms were emitted from the AU sample, directed towards, and adsorbed onto the $TiO_2$ (110).

Example 2

Figure 5:
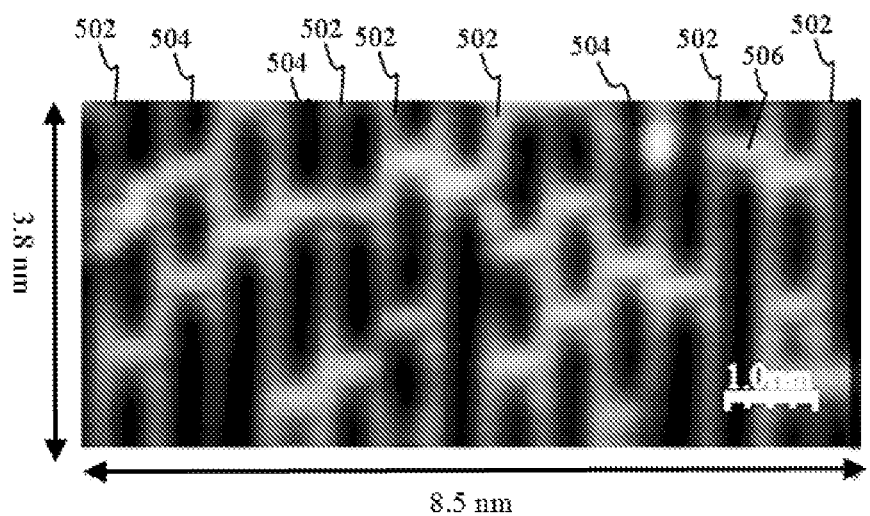
FIG. 5 is a STM image of the rutile $TiO_2$ (110) clean surface.

Characterization Metal Oxide Substrate ($TiO_2$) and of Metal (Au) Deposited on the $TiO_2$ FIG. 5 is a STM image of the rutile $TiO_2$ (110) clean surface. Alternating bright rows 502 are titanium and dark rows 504 are oxygen. Oxygen vacancies 506 are observed as bright spots along the dark lines (i.e., bridging two bright lines). Because there was one bridging O vacancy in each unit cell (0.295×0.65 nm$^2$) the amount of surface oxygen vacancies was calculated from the STM image to be about 10%.

Figure 6:
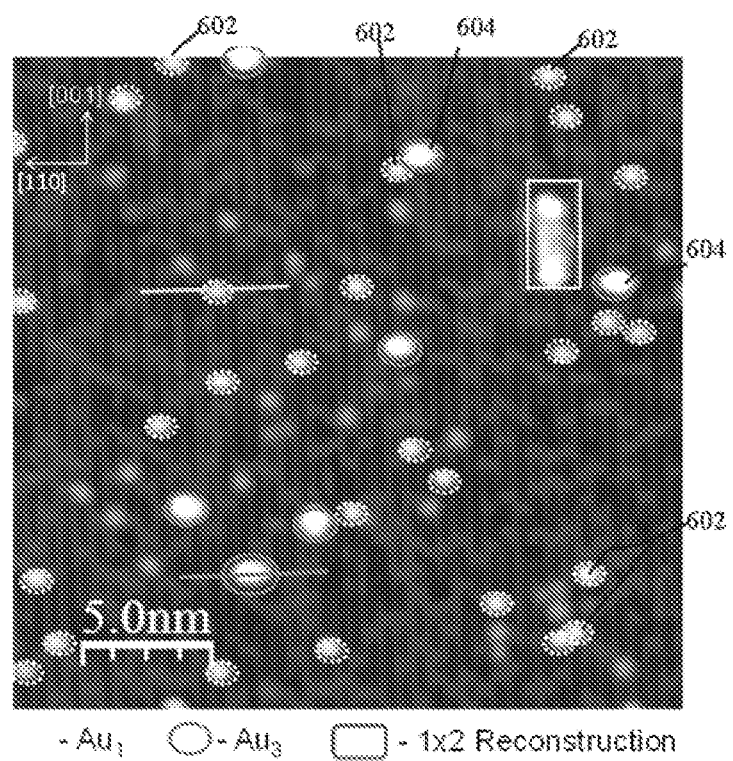
FIG. 6 depicts a STM image of a $TiO_2$ (110) surface on which Au was deposited at 300 K.
Figure 7:
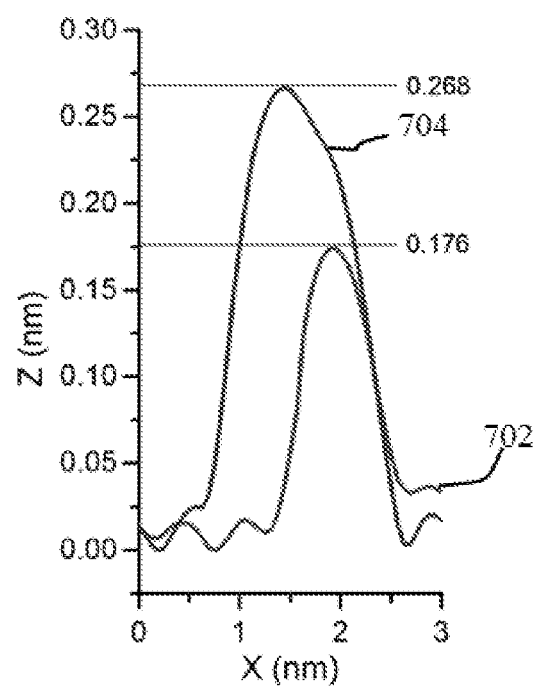
FIG. 7 depicts height profiles for $Au_1$ and $Au_3$ particles.
Figures 8A, 8B:
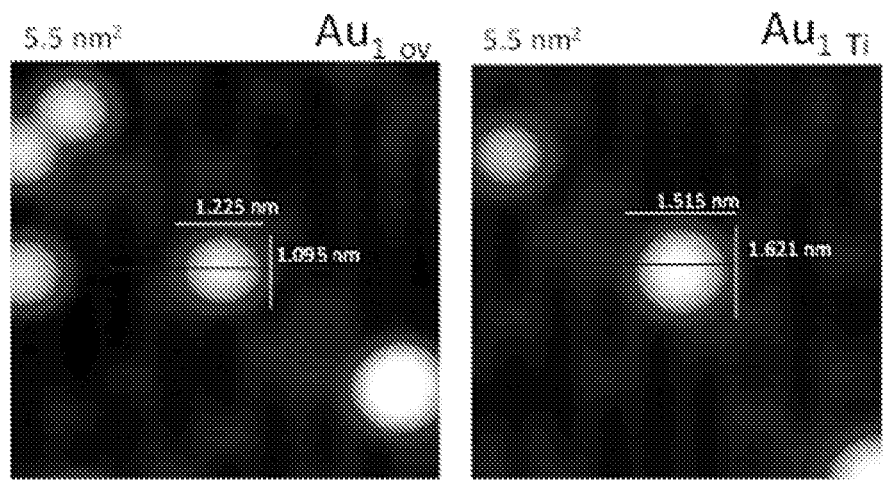
FIG. 8A depicts a STM image of one Au atom on top of an oxygen vacancy.
FIG. 8B depicts a STM image of one Au atom on top of a surface Ti atom.
Figure 9:
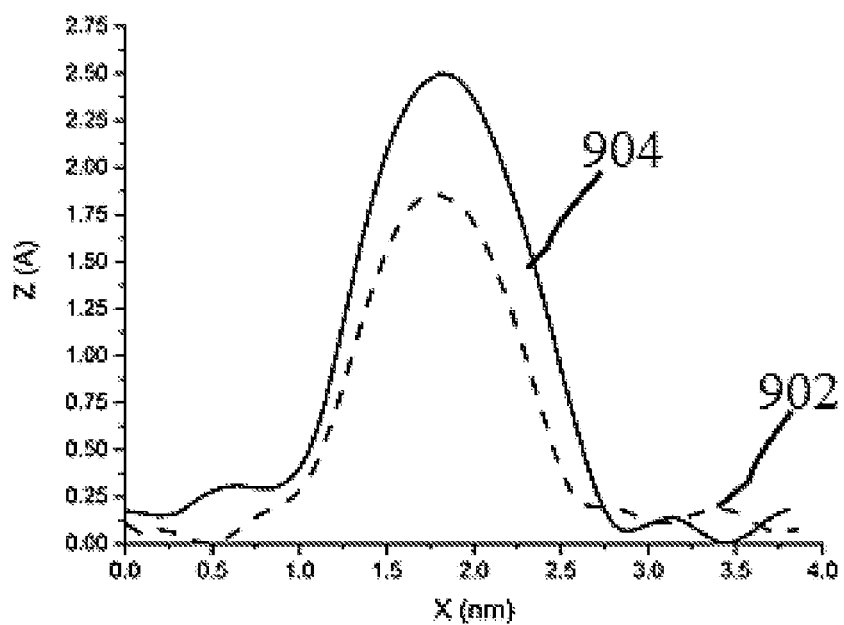
FIG. 9 depicts height profiles of the Au species in FIGS. 8A and 8B as a function of x in nm along the [11bar0] directions.

FIG. 6 depicts a STM image of a $TiO_2$ (110) surface on which Au was deposited at 300 K. The image was 50×50 nm$^2$ topographic STM image of the $TiO_2$ (110) surface recorded at 78 K, with Au being dosed at 300 K. The $TiO_2$ (110) surface includes $Au_1$ atoms 602 and $Au_3$ particles 604. A 1×2 reconstruction precursor (boxed section) was recorded using a 1.2 V bias voltage and a 0.01 nA tunneling current. Small particles of Au were observed to be distributed homogeneously over the terraces of the substrate. The smallest particles (i.e., $Au_1$ atoms) appeared to adsorb on the $O_b$ rows, while larger particles ($Au_3$ particles) spanned multiple sites either being centred on a bridging oxygen atoms ($O_b$) or along Ti rows. The $Au_1$ particles on the sample appear round with an average height of 1.8 Å (FIG. 7), which correlated with known values for gold height on titanium dioxide surfaces. FIG. 7 depicts height profiles for $Au_1$ (data line 702) and $Au_3$ (data line 704) particles. FIG. 8A depicts a STM image of one Au atom on top of an oxygen vacancy. FIG. 8B depicts a STM image of one Au atom on top of a surface Ti atom. FIG. 9 depicts height profiles of the Au species as a function of x in nm along the [11bar0] directions. It was noted that the height of Au atoms sitting on top of an oxygen vacancy was lower (and narrower) (data line 902) than that on top of a surface Ti atoms by about 0.6 Å (data line 804).

Using similar comparisons described above to identify $Au_1$, larger clusters where identified as $Au_3$. The $Au_3$ particles appeared slightly elongated in the [1$\bar{1}$0] direction and had a higher height profile than the monomers (~2.6 Å).

In addition to $Au_1$ and $Au_3$ nanoparticles a third species was surprisingly observed. The features of the third species resembled $Au_3$, however, they appeared on top of the Ti rows and were elongated to a lesser extent than the $Au_3$. Additionally, the features of the species were orientated along the [1$\bar{1}$0] direction rather than the [001] direction. Using high contrast images (See, FIGS. 10A and 10B), two nodes were apparent at the center of the feature of the unidentified species. Thus the species was identified as a $Au_2$ species. FIG. 10A depicts 7×7 $nm^2$ topographic STM image of a $Au_2$ particle. FIG. 10B depicts a high contrast, close-up of the particle, revealing a figure of eight like shape at the center. FIG. 10C depicts a high contrast, close-up of the particle, with an overlay highlighting the two nodes at the center. All the images in FIGS. 10A-10C were recorded at 78 K with 0.8 V voltage bias and a tunneling current of 0.05 nA. It was also determined, after applying a series of tip pulses (−2, −2.4, −2.8 −3 and −4 V) the identified $Au_2$ species did not move or desorb, suggesting that it is tightly bound to the surface.

Example 3

Transferring Metal Atoms

Figure 12:
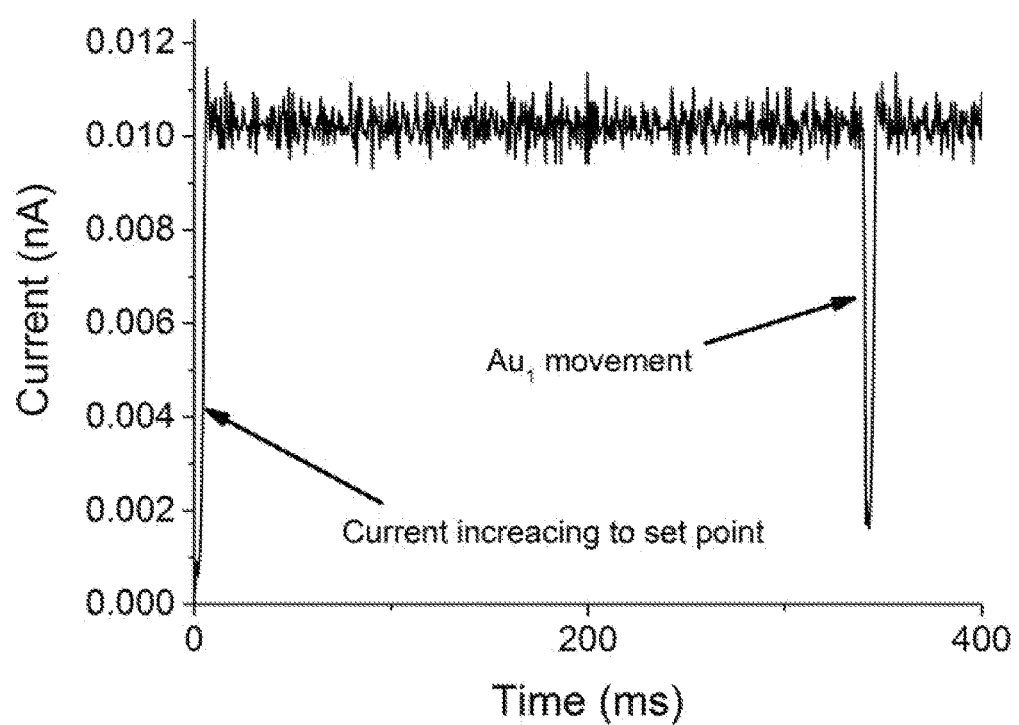
FIG. 12 depicts a scan of current as a function of time upon pulsing an $Au_1$ atom.
Figure 13:
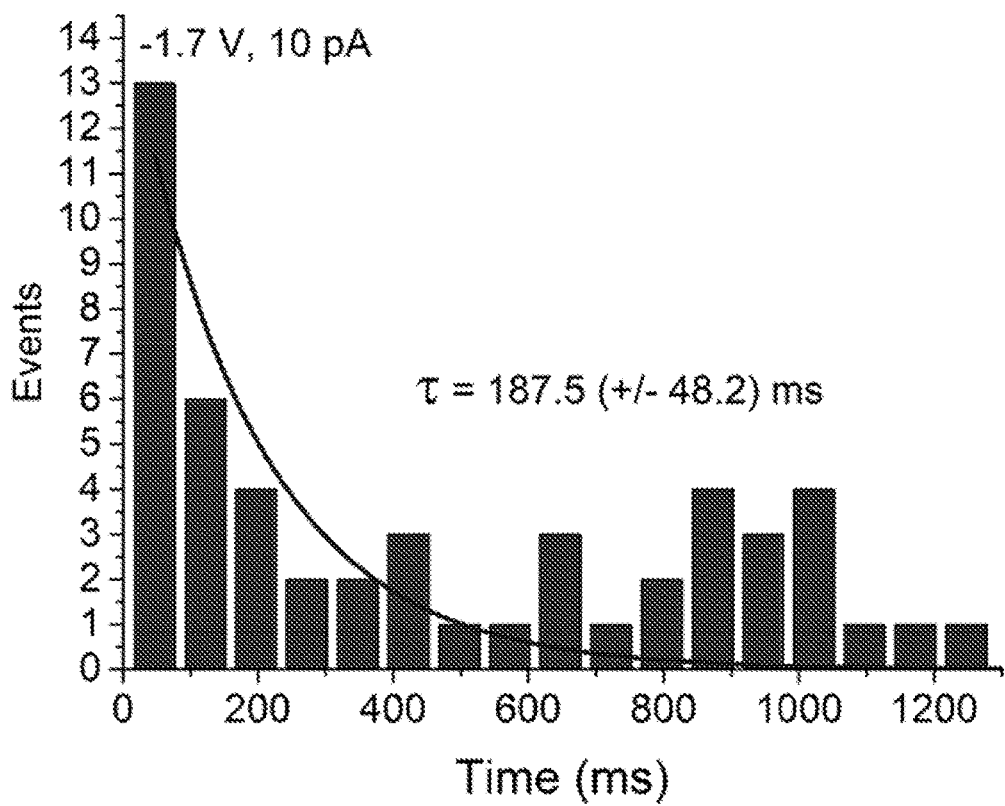
FIG. 13 is a plot of the number of events (N) as a function of time needed for $Au_1$ movement along the surface of rutile $TiO_2$(110) upon pulsing with −1.7 V.

A −2 V pulse at 50 pA was applied on a $Au_1$ atom on top of an oxygen vacancy to move the $Au_1$ atom to another $Au_1$ atom on top of an oxygen vacancy and form a $Au_2$ species on an oxygen vacancy. FIGS. 11A and 11B depict STM images of STM tip induction of $Au_1$ atom before pulsing and after pulsing. FIG. 11A depicts pulsing of first $Au_1$ atom 1102 before pulsing. In FIG. 11A, atom 1102 is adjacent to a second $Au_1$ atom 1104. During pulsing, the first $Au_1$ atom 1102 moved toward second $Au_1$ atom 1104 as shown by the arrow. Additional $Au_1$ atoms were also observed to move upon pulsing. After pulsing, $Au_2$ species 1106 was formed from the first $Au_1$ atom 1102 and the second $Au_1$ atom 1104. FIG. 12 depicts a scan of current as a function of time upon pulsing the $Au_1$ atom. As seen in FIG. 12, a sharp decrease in the current (I) that occurred after about 340 ms. Without wishing to be bound by theory, it is believed that the change (decrease) in current (due to a decrease in the electronic density of the newly formed species underneath the tip) is associated with Au movement leaving behind a less dense charged site. In other words, desorption of the Au atom is not associated by electronic loss. In a second experiment, a fixed voltage of −1.7 V with 10 pA was used and number of events at a given time was determined. FIG. 13 is a plot of the number of events (N) as a function of time needed for $Au_1$ movement along the surface of rutile $TiO_2$(110) upon pulsing with −1.7 V. The Y axis presents the number of events (movements of atoms) that occurred at a given time. The number of events (N) is seen to show a non-linear dependence on time.

Figure 14:
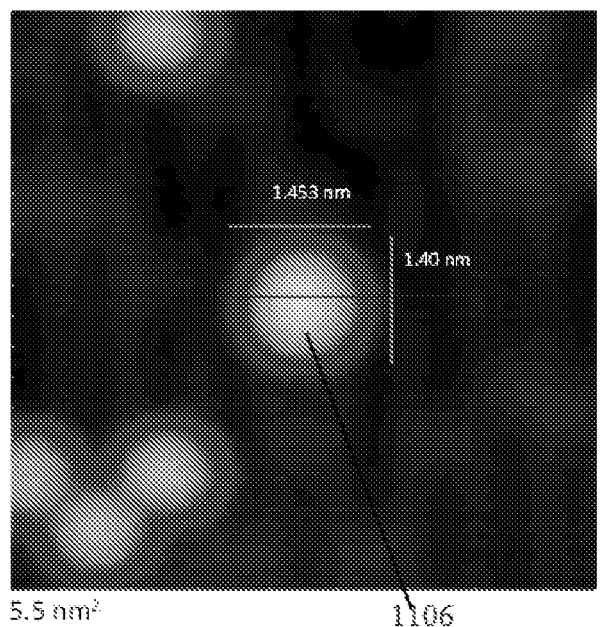
FIG. 14 depicts a STM image of $Au_2$ species on top of an oxygen vacancy.
Figure 15:
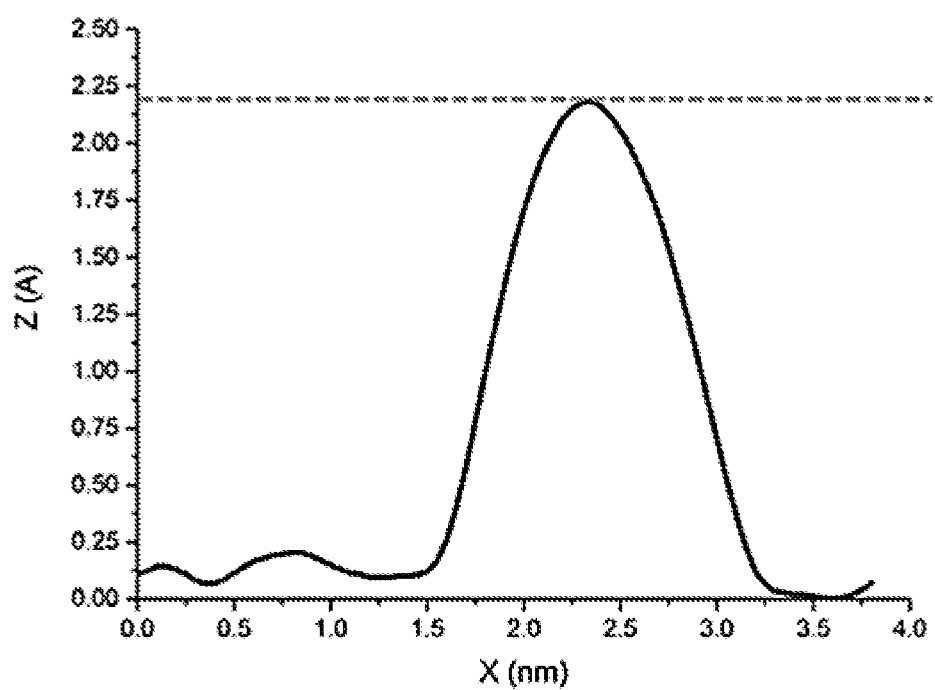
FIG. 15 is a height profile of the $Au_2$ species in FIG. 14 as a function of x in nm along the [11bar0] directions.

FIG. 14 depicts a STM image of formed $Au_2$ species 1106 on top of an oxygen vacancy. FIG. 15 is a height profile of the $Au_2$ species 1106 as a function of x in nm along the [11bar0] directions.

Not all pulses resulted in the formation of an $Au_2$ species, however, they did result in movement of Au atoms across the rows inducing movement of the (adjacent) second atom farther away (See, for example arrows in FIG. 11A). From these experiments and many similar others it is possible to conclude that pulsing of ca. −2V on $Au_1$ atoms resulted in their movement in a repeatable manner. It was also possible, using the same applied voltage as above, to change the $Au_1$ atom position from being adsorbed on an oxygen vacancy to and adsorption on a surface Ti atom.

Example 4

Mathematical Model

A mathematical model was developed to model the energy needed for the movement of the metal (e.g., $Au_1$) atoms. The model incorporated the current intensity as well as time at a fixed pulse voltage was based on the model for tip induced desorption of hydrogen described by Acharya et al., *J. Phys. Chem. C* 2010, Vol. 114, pp. 21510-21515. The number of events (N) in FIG. 14 showed a non-linear dependence on time and was fitted by an exponential decay function incorporating a time constant ($\tau$) (or the average value of time exposure before desorption)

$$N(t)=\exp(-t/\tau) \qquad \text{Equation 3.}$$

Once ($\tau$) is determined, the desorption yield, Y (the number of atoms desorbed per the number of electrons) can be expressed by $$Y=e/I\tau \qquad \text{Equation 4.}$$

where e is the electron charge (1.6×10$^{-19}$ C), ($\tau$) is the time constant obtained from Equation 3. The expression of the yield indicated how much charge (C) was needed to desorb (I=C s$^{-1}$) a Au atom. The desorption rate (Y/($\tau$)) was calculated from the current needed $$R=YI/e \qquad \text{Equation 5.}$$

In order to gauge the number of electrons used for a desorption process the yield by a power law dependence Y was approximated as $$Y \propto I^{(n-1)} \qquad \text{Equation 6.}$$

For n=1 the yield was independent of the current while for n=2 the yield was directly proportional to the current. Taking the logarithm of Equation 6 and reorganising it, Equation 7 was obtained:

$$(n-1) \propto \log Y/\log I \qquad \text{Equation 7.}$$

Figure 16:
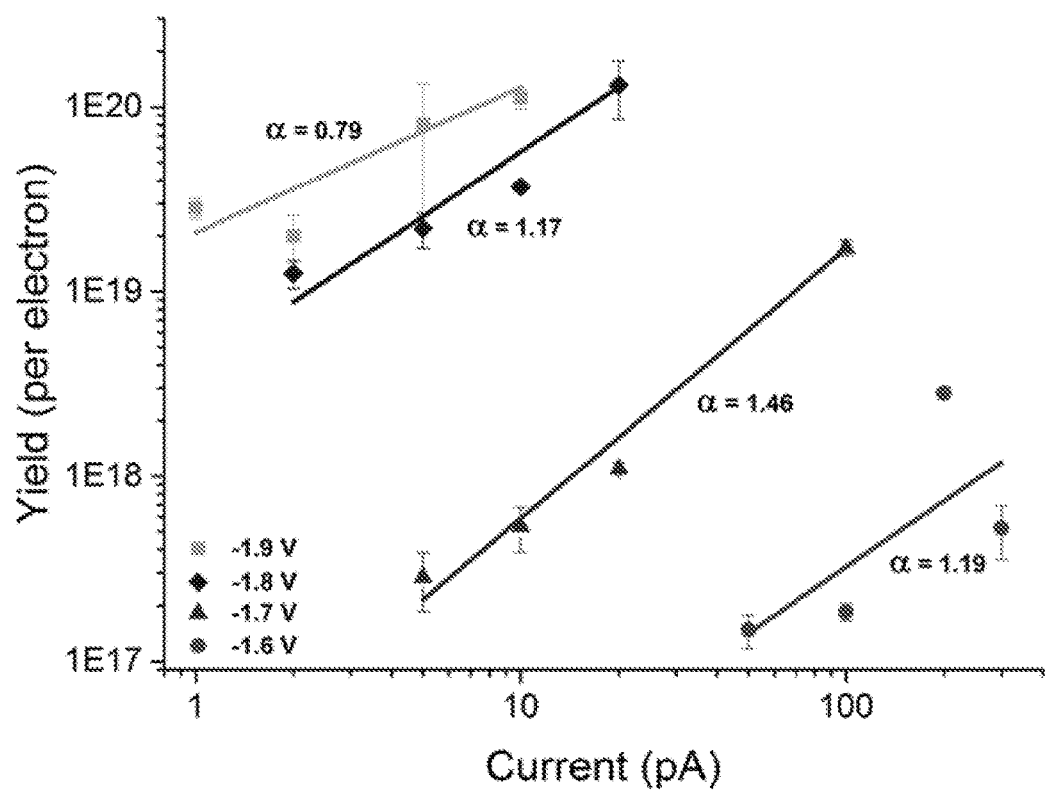
FIG. 16 depicts a plot of the movement of $Au_1$ atom yield per electron as a function of current various pulse voltages.

Therefore plotting log Y as a function of log I would yield a straight line with a slope $\alpha=(n-1)$. FIG. 16 depicts a plot of the reaction (movement of $Au_1$ atom) yield (log Y) as a function of current (log I) at the indicated pulse voltage. The data line with square markers was at −1.9 V, the data line with diamond markers was at −1.8 V, the data line with triangle markers was at −1.7 V, the data line with circle marker was at −1.6 V. The slope $\alpha$ is found to be between 0.8 and 1.5 or n between 1.8 and 2.5 which was approximated to 2 electrons per desorption, which was in agreement with the initial site for adsorption of $Au_1$ atom on an oxygen vacancy (which is nominally a 2 electrons vacancy of the two Ti sites–$Ti^{3+}$).

The invention claimed is:

1. A method of transferring a single metal atom from a first location to a second location on the surface of a metal oxide, the method comprising:
   (a) obtaining a material having metal atoms deposited on the surface of a metal oxide, wherein a first metal atom is deposited on a first oxygen atom vacancy of the metal oxide; and
   (b) transferring the first metal atom on the first oxygen atom vacancy to a second location on the metal oxide by applying a voltage to the first metal atom, wherein the second location is a second metal atom on a second oxygen atom vacancy of the metal oxide, and wherein the first and second metal atoms form a first metal atom-second metal atom species, or wherein the second location is a metal atom of the metal oxide, and wherein the first metal atom and the metal atom of the metal oxide forms a first metal atom-metal atom of the metal oxide species.

2. The method of claim 1, wherein the metal oxide is titanium dioxide and the metal atoms deposited on the surface of the titanium dioxide are gold atoms.

3. The method of claim 2, wherein the first metal atom-second metal atom species is a Au—Ti species.

4. The method of claim 2, wherein the first metal atom-metal atom of the metal oxide species is a Au—Ti species.

5. The method of claim 2, wherein the titanium dioxide is single phase anatase or single phase rutile.

6. The method of claim 2, wherein the titanium dioxide comprises a mixture of anatase and rutile.

7. The method of claim 6, wherein the ratio of anatase to rutile ranges from 1.5:1 to 10:1.

8. The method of claim 6, wherein the titanium dioxide is a mixed phase of anatase and rutile.

9. The method of claim 1, wherein the voltage ranges from −3.0 V to +3.0.

10. The method of claim 9, wherein the voltage is pulsed voltage.

11. The method of claim 9, wherein the voltage is applied for 300 milliseconds to 400 milliseconds at a current of 25 pA to 75 pA.

12. The method of claim 1, wherein the metal oxide is $TiO_2$, $SnO_2$, $Fe_2O_3$, ZnO, or any combination thereof.

13. The method of claim 1, wherein the metal atoms deposited on the surface of the metal oxide are gold, silver, palladium, rhodium, or platinum atoms.

14. The method of claim 1, wherein the surface of the metal oxide is reduced.

15. The method of claim 1, wherein a scanning tunneling microscope (STM) is used in step (b) to transfer the first metal atom on the first oxygen atom vacancy to a second location on the metal oxide by applying a voltage to the first metal atom.

16. The method of claim 15, wherein the STM has a tungsten tip.

17. The method of claim 1, wherein a cluster of metal atoms having a targeted size is obtained.

18. The method of claim 1, wherein the material is a photocatalyst.

19. A photocatalyst made by a method of claim 1.

20. A method for designing a photocatalyst comprising selectively obtaining a desired size and/or position of a metal cluster deposited on a metal oxide by using the method of claim 1.

* * * * *